United States Patent
Patil et al.

(10) Patent No.: US 10,181,860 B1
(45) Date of Patent: Jan. 15, 2019

(54) REDUCING RESIDUE SIGNALS IN ANALOG-TO-DIGITAL CONVERTERS

(71) Applicant: Analog Devices Global Unlimited Company, Hamilton (BM)

(72) Inventors: Sharvil Pradeep Patil, Toronto (CA); Hajime Shibata, Toronto (CA); Wenhua William Yang, Lexington, MA (US); David Nelson Alldred, Toronto (CA); Yunzhi Dong, Weehawken, NJ (US); Gabriele Manganaro, Winchester, MA (US); Kimo Tam, Lincoln, MA (US)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/794,367

(22) Filed: Oct. 26, 2017

(51) Int. Cl.
 H03M 1/14 (2006.01)
 H03M 1/06 (2006.01)
 H03M 1/00 (2006.01)
 H03M 3/00 (2006.01)

(52) U.S. Cl.
 CPC .......... H03M 1/145 (2013.01); H03M 1/001 (2013.01); H03M 1/06 (2013.01); H03M 3/412 (2013.01)

(58) Field of Classification Search
 None
 See application file for complete search history.

(56) References Cited

U.S. PATENT DOCUMENTS

| 5,206,647 A | 4/1993 | Stone |
| 7,289,053 B2 * | 10/2007 | Bunin ..................... H03M 1/06 341/155 |
| 8,896,475 B2 | 11/2014 | Shibata |
| 9,312,840 B2 | 4/2016 | Dong et al. |
| 9,621,175 B2 * | 4/2017 | Pagnanelli ............ H03M 3/404 |

(Continued)

FOREIGN PATENT DOCUMENTS

EP 0283296 5/1990

OTHER PUBLICATIONS

José Franca et al., *Multirate Analog-Digital Systems for Signal Processing and Conversion*, 0018-9219/97 © 1997 IEEE, Proceedings of the IEEE, vol. 85, No. 2, Feb. 1997, 21 pages.

(Continued)

*Primary Examiner* — Howard Williams
(74) *Attorney, Agent, or Firm* — Patent Capital Group

(57) ABSTRACT

A residue generation apparatus for use in continuous-time and hybrid ADCs is proposed. The apparatus includes a quantizer for digitizing an analog input to generate a digital output, and means for applying a first transfer function to the digital output from the quantizer to generate a digital input to a feedforward DAC, based on which the DAC can generate a feedforward path analog output. The apparatus further includes means for applying a second, continuous-time, transfer function to the analog input provided to the quantizer to generate a forward path analog output, and a subtractor for generating a residue signal based on a difference between the forward path analog output and the feedforward path analog output. Proposed apparatus allows selecting a combination of the first and second transfer functions so that, when each is applied in its respective path, the residue signal passed to further stages of an ADC is reduced.

29 Claims, 14 Drawing Sheets

(56) References Cited

U.S. PATENT DOCUMENTS

| | | | |
|---|---|---|---|
| 2005/0053126 | A1 | 3/2005 | Balamurugan et al. |
| 2005/0275577 | A1 | 12/2005 | Bjornsen |
| 2013/0136282 | A1* | 5/2013 | McClain ............... H03G 3/32 |
| | | | 381/316 |
| 2014/0168000 | A1* | 6/2014 | Lemkin ............... H03M 1/1245 |
| | | | 341/172 |
| 2016/0373101 | A1 | 12/2016 | Dong et al. |
| 2017/0317860 | A1* | 11/2017 | Bolatkale ............ H03M 1/001 |

OTHER PUBLICATIONS

Jurgen Deveugele et al., *Parallel-Path Digital-to-Analog Converters for Nyquist Signal Generation*, 0018-9200/04, © 2004 IEEE, IEEE Journal of Solid-State Circuits, vol. 39, No. 7, Jul. 2004, 10 pages.

Paul T.M. van Zeijl et al., *On the Attenuation of DAC Aliases Through Multiphase Clocking*, 1549-7747 © 2009 IEEE, IEEE Transactions on Circuits and Systems—II: Express Briefs, vol. 56, No. 3, Mar. 2009, 5 pages.

Karthikeyan Reddy et al., *a 16-mW 78-dB SNDR 10-MHz BW CT ΔΣ ADC Using Residue-Cancelling VCO-Based Quantizer*, 0018-9200 © 2012 IEEE, IEEE Journal of Solid-State Circuits, vol. 47, No. 12, Dec. 2012, 12 pages.

Amrith Sukumaran et al., *Low Power Design Techniques for Single-Bit Audio Continuous-Time Delta Sigma ADCs Using FIR Feedback*, 0018-9200 © 2014 IEEE, IEEE Journal of Solid-State Circuits, vol. 49, No. 11, Nov. 2014, 11 pages.

Yunzhi Dong et al., *A Continuous-Time 0—3 MASH ADC Achieving 88 dB DR With 53 MHz BW in 28 nm CMOS*, 0018-9200 © 2014 IEEE, IEEE Journal of Solid-State Circuits, vol. 49, No. 12, Dec. 2014, 10 pages.

Yunzhi Dong et al., *A 72 dB-DR 465 MHz-BW Continuous-Time 1-2 MASH ADC in 28 nm CMOS*, 1558-173X © 2016 IEEE, IEEE Journal of Solid-State Circuits, vol. 51, No. 12, Dec. 2016, 11 pages.

Hajime Shibata et al., *A 9GS/s 1GHz-BW Oversampled Continuous-Time Pipeline ADC Achieving—161dBFS/Hz NSD*, ISSCC 2017, Session 16, Gigahertz Data Converters, 16.2, 2017 IEEE International Solid-State Circuits Conference, 978-1-5090-3758-2/17 © 2017 IEEE, 3 pages.

Will Yang, *CT Pipeline Front-end Matching*, Jan. 19, 2017, 6 pages.

Mohamed Abouzied et al., A Process-Tolerant Out-of-Band Blocker Rejection Technique for SAW-less Receivers, Microelectronics Journal 45 (2014) 4 pages.

B. Bakkaloglu et al., Chapter 2, Design of Power, Dynamic Range, Bandwidth and Noise Scalable ADCs, Springer-Verlag, Berlin Heidelberg 2014, 54 pages.

Non-Final Office Action issued in U.S. Appl. No. 15/974,548 dated Aug. 6 2018, 15 pages.

\* cited by examiner

REDUCING RESIDUE SIGNALS IN ANALOG-TO-DIGITAL CONVERTERS

TECHNICAL FIELD OF THE DISCLOSURE

The present disclosure relates generally to analog-to-digital converters and, more particularly, to techniques for reducing residues in residue generation systems of analog-to-digital converters.

BACKGROUND

Real-world analog signals such as temperature, pressure, sound, or light are routinely converted to a digital representation that can be easily processed in modern digital signal processing systems. The circuits that perform this conversion of an analog input signal to a digital output signal are analog-to-digital converters (ADCs). ADCs can translate analog electrical signals representing real-world phenomena such as temperature, pressure, sound, or light to digital signals for data processing purposes.

ADCs can be found in many places such as broadband communication systems, audio systems, receiver systems, etc., and are used in a broad range of applications including Communications, Energy, Healthcare, Instrumentation and Measurement, Motor and Power Control, Industrial Automation and Aerospace/Defense. For example, in precision measurement systems, electronics may be provided with one or more sensors to make measurements, and these sensors may generate an analog signal. The analog signal would then be provided to an ADC as an input to generate a digital output signal for further processing. In another example, an antenna may generate an analog signal based on the electromagnetic waves carrying information/signals in the air. The analog signal generated by the antenna is then provided as an input to an ADC to generate a digital output signal for further processing.

Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figures 1A, 1B:
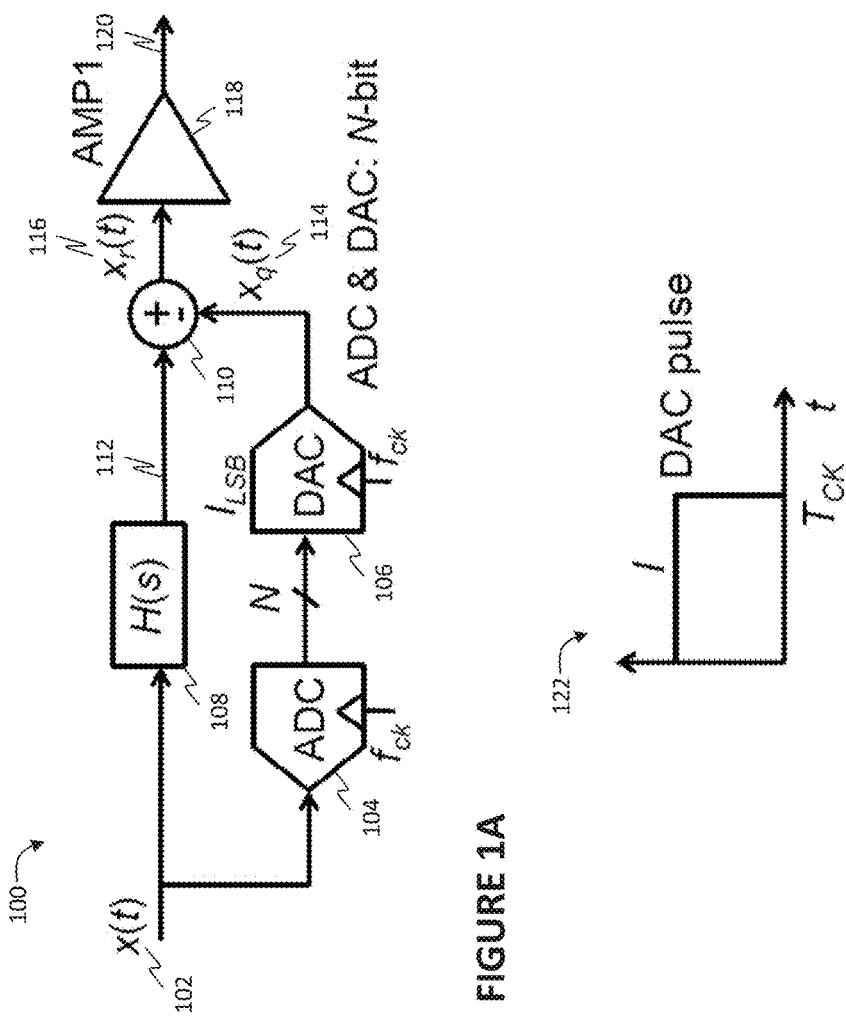
FIG. 1A is an illustrative system diagram of a conventional continuous-time residue generation system.
FIG. 1B is an illustration of a non-return-to-zero digital-to-analog converter (DAC) pulse.

Continuous-time (CT) residue generation systems are increasingly popular in high-performance and high-speed ADCs. These systems are, however, marred by the presence of strong images in the output spectrum of a DAC used therein, which can result in a prohibitively high residue amplitude. Therefore, the DAC images are first filtered to keep the residue within acceptable limits. Depending on the amount of image attenuation required and, hence, the acceptable residue amplitude, a certain degree of oversampling may be necessary in a quantizer. For instance, in CT pipelined ADCs, an oversampling ratio of at least 4 may be necessary along with additional filtering in the inter-stage residue amplifiers. This limits the maximum achievable ADC bandwidth to one eighth of the sampling frequency and, furthermore, the oversampled nature of the digital output imposes a significant power penalty on the backend digital processing blocks.

Embodiments of the present disclosure provide mechanisms for reducing residue signals in ADCs. Mechanisms described herein may be applicable to CT as well as hybrid (i.e. part CT, part discrete-time (DT)) ADCs and may be implemented in ADCs of various types of architectures, such as e.g. pipelined ADCs, multi-stage noise shaping (MASH) ADCs, voltage controller oscillator (VCO) ADCs, and other ADCs utilizing generation and processing of residue signals. Some of the mechanisms described herein may be especially attractive for high-performance and high-speed converter applications. One aspect of the present disclosure provides a residue generation system that includes a quantizer for digitizing an analog input and generating a digital output, as well as means for applying a first transfer function, referred to herein as a "feedforward path transfer function" and denoted as a transfer function F, to the digital output from the quantizer to generate a digital input provided to a feedforward DAC, based on which input the feedforward DAC generates a feedforward path analog output. The residue generation system further includes means for applying a second, CT, transfer function, referred to herein as a "forward path transfer function" and denoted as transfer function G, to the analog input that was provided to the quantizer, to generate a forward path analog output. The residue generation system also includes a subtractor for generating a residue signal based on a difference between the forward path analog output and the feedforward path analog output. Proposed residue generation system allows selecting a combination of the feedforward path transfer function and the forward path transfer function so that, when each is applied in its respective path (i.e. when the feedforward path transfer function is applied in the feedforward path and the forward path transfer function is applied in the forward path), input signal content, input signal aliases, and out-of-band quantization error can be substantially rejected from the residue signal, thus advantageously reducing the residue signal passed to further stages of an ADC.

Basics of ADCs and Challenges with Residue Signals

ADCs are electronic devices that convert a continuous physical quantity carried by an analog signal to a digital number that represents the quantity's amplitude (or to a digital signal carrying that digital number). The conversion involves quantization of the analog input signal, i.e. a process of mapping input values from a continuous set of analog values to output values in a countable smaller set of digital values, so it would introduce a small amount of error. Typically the quantization occurs through periodic sampling of the analog input signal. The result is a sequence of digital values (i.e., a digital signal) that represents conversion of a continuous-time and continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal to noise ratio (SNR), signal-to-noise-and-distortion ratio (SINAD), effective number of bits (ENOB), total harmonic distortion (THD), total harmonic distortion plus noise (THD+N), and spurious free dynamic range (SFDR). ADCs have many different designs, which can be chosen based on the application requirements and performance specifications.

ADCs based on CT residue generation systems are increasingly popular in high-performance and high-speed data converters, thanks to their inherent anti-aliasing and their potential to achieve high sampling rates. An example of a conventional CT residue generation system 100 is shown in FIG. 1A. As shown in FIG. 1A, a CT analog input, x(t), 102 is sent to two different paths. A first path, which may be described as a "feedforward" path, includes a cascade of a quantizer 104 and a feedforward DAC 106. A second path, which may be described as a "forward" path, includes a CT analog transfer function, H(s), 108. The CT analog input x(t) 102 is applied to the CT analog transfer function H(s) 108 in the forward path and to a cascade of the N-bit ADC implementing the quantizer 104 and an N-bit DAC implementing the feedforward DAC 106, clocked at a sampling rate of $f_{ck}$ in the feedforward path. A subtractor 110 then subtracts the output 112 of the transfer function H(s) 108 from the output, $x_q(t)$, 114 of the DAC 106 to generate a residue signal, $x_r(t)$, 116. This residue signal may then be processed, e.g. filtered and amplified by an amplifier, $AMP_1$, 118, and the processed residue signal 120 may be provided to subsequent stages in an ADC (not shown in FIG. 1A).

Oftentimes, e.g. in the case of CT pipelined ADCs, the transfer function H(s) 108 is the transfer function of a CT analog delay. The feedforward DAC 106 is usually a non-return-to-zero (NRZ) DAC, and can be either in voltage or current mode, but is typically the latter. In such a case, the DAC 106 outputs an NRZ current pulse, an example of which is shown in FIG. 1B as a DAC pulse 122, that lasts for a clock period, $T_{ck}$, and has an amplitude proportional to the current of the lowest-significant bit (LSB), $I_{LSB}$ (the current $I_{LSB}$ is also indicated in FIG. 1A above the DAC 106).

Figure 1C:
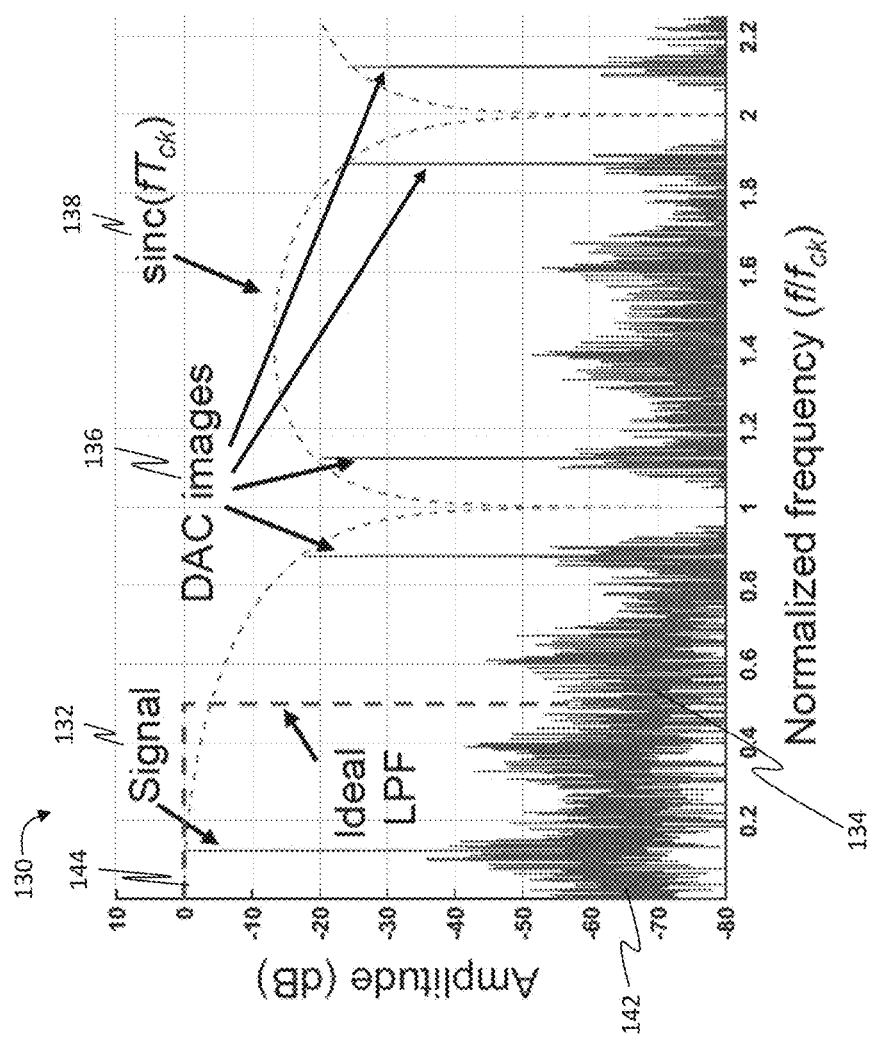
FIG. 1C is an illustration of an exemplary DAC output spectrum with a sinc filter and an ideal low-pass filter magnitude response.

An example spectrum at the output of the DAC 106 is shown as a spectrum 130 of FIG. 1C. Such a spectrum may e.g. be obtained by applying a single-tone input at frequency $f_{in}$=0.125 Hz ($f_{ck}$=1 Hz) to the system of FIG. 1A with a quantizer resolution of 4 bits. As shown in FIG. 1C, the output spectrum 130 includes a signal component 132, broadband quantization error 134, and images/aliases 136 at $nf_{ck} \pm f_{in}$ (where n is an integer) created by the sampling operation in the quantizer 104. The NRZ pulse shape 122, as shown in FIG. 1B, of the DAC 106 provides a sinc filter transfer function, shaping the spectrum by $\text{sinc}(fT_{ck})$ 138, shown with a thin dashed line in FIG. 1C. This attenuates the images 136 and the high-frequency components of the quantization error 134 to some extent. The sinc transfer function has nulls at integer multiples of $f_{ck}$, and, therefore, it attenuates the DAC images 136 which are closer to the nulls more strongly compared to those which are not. If the images are not sufficiently attenuated, the amplitude of the residue $x_r(t)$ 116 at the output of the subtractor 110 in FIG. 1A is likely to overload the subsequent ADC stages. For example, in the case of an example CT pipelined ADC with a first-order low-pass residue amplifier $AMP_1$ 118 with a low-frequency gain (also referred to as "DC gain") of 8, the DAC images 136 have to be attenuated by at least 17 dB relative to the signal component 132 to keep the amplitude of the processed output residue signal 120 within reasonable limits. For the case of the NRZ DAC pulse (with the sinc filter), this requirement restricts the maximum input frequency, and hence the ADC input bandwidth, to $f_{ck}/8$. Conversely, for a given input bandwidth, $f_{BW}$, the ADC needs to be oversampled with an oversampling ratio (OSR) of at least 4. The oversampled nature of the digital output imposes a significant power penalty on the backend digital processing blocks.

Why the output spectrum 130 is marred by the presence of strong images, which result in a prohibitively high residue amplitude, can be explained as follows. As was explained with reference to FIG. 1A, in conventional implementations, the forward path consists of only the signal component, with a delay determined by H(s). Therefore, when its output 112 is subtracted from the output 114 of the DAC 106 in the feedforward path, the resulting residue 116 spectrum is identical to that of the DAC output as shown in FIG. 1C but without the signal component. Thus, it includes broadband quantization error and DAC images shaped by a sinc transfer function. Ideally, however, the residue signal that is passed to subsequent stages of an ADC should consist of nothing but the in-band quantization error (shown in FIG. 1C as an in-band quantization error 142, which is a portion of the broad band quantization error 134 but demarcated through the ideal low-pass filter (LPF) magnitude response 144, also shown in FIG. 1C). The presence of all other components in the residue spectrum 130 are then an unnecessary burden on the subsequent stages (e.g. to filter or digitize them).

As the foregoing illustrates, improvements with respect to generating residue signals would be desirable.

Improved Residue Generation Systems

Embodiments of the present disclosure propose systems and methods for generating residue signals of a CT residue generation stage of an ADC based on the use of analog and/or digital transfer functions in the forward and feedforward paths so that the DAC images are rejected better, thereby reducing the output residue amplitude and allowing to decrease the OSR, and so that the output spectrum of a residue signal includes mainly the in-band quantization error. Generating residue signals in the manner proposed herein may simplify the design of the subsequent blocks of an ADC which process the residue signals, and may lower the power dissipation of the backend digital processing blocks along with that of the CT residue generation system itself. For example, for a given image rejection, and, hence, a given residue amplitude, requirement, the residue generation technique described herein can allow a reduction in the oversampling ratio: that is, the ADC bandwidth can be increased for a given sampling frequency or the sampling frequency can be reduced for a given ADC bandwidth. The latter will result in a lower output data rate and, consequently, lower the power dissipation in the backend digital processing circuits.

Figure 2:
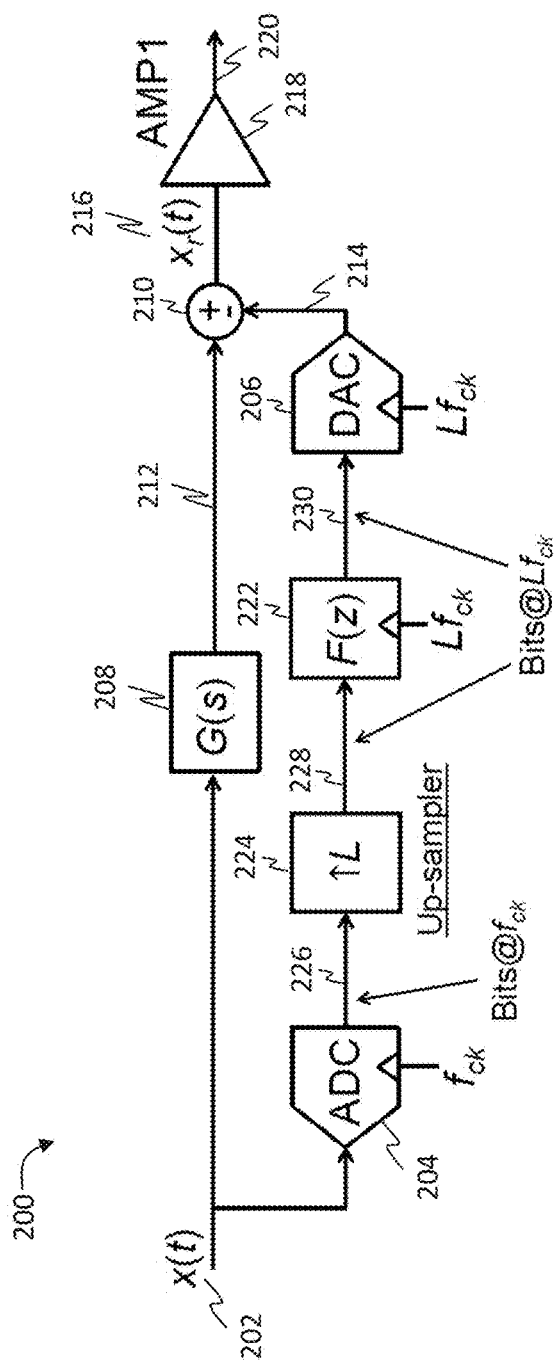
FIG. 2 is an illustrative system diagram of a residue generation system according to some embodiments of the present disclosure.

FIG. 2 is an illustrative system diagram of a residue generation system 200 according to some embodiments of the present disclosure. The system 200 may be used as a residue generator in a CT stage of any of suitable multi-stage ADCs, such as e.g. CT as well as hybrid ADCs, implemented in various types of architectures, such as e.g. pipelined ADCs, MASH ADCs, VCO ADCs, and other ADCs utilizing residue signals.

As shown in FIG. 2, a CT analog input, x(t), 202 is sent to two different paths—a feedforward path and a forward path.

The first path (i.e. the feedforward path) may include a cascade of a quantizer 204 and a feedforward DAC 206 similar to those described above. In contrast to the conventional implementation shown in FIG. 1A, the first path of the system 200 further includes a feedforward transfer function 222, illustrated in FIG. 2 as "F(z)," indicating that it is a DT transfer function. While this and some other FIGURES refer to the feedforward transfer function as being implemented in DT, in other embodiments, it may be replaced with a CT transfer function (in which case the illustration of FIG. 2 would replace the label for the transfer function 222 to "F(s)"), all of which embodiments being within the scope of the present disclosure. Optionally, the feedforward path may further include an up-sampler 224, also shown in FIG. 2, configured to up-sample the digital output from the quantizer 204 by an up-sampling factor L, where L is an integer equal to or greater than 1. While the quantizer 204 may be clocked at a sampling rate of $f_{ck}$ in the feedforward path, the feedforward transfer function F(z), and the feedforward DAC 206 may be clocked at $Lf_{ck}$, when the up-sampler 224 is used. In such an implementation, the quantizer 204 receives the CT analog input x(t) 202 and digitizes it to generate a digital output 226 in a form of a sequence of bits clocked at a sampling rate of $f_{ck}$, as indicated in FIG. 2. If the up-sampler 224 is used, it converts the digital output 226 to an up-sampled digital output 228 in a form of a sequence of bits clocked at a sampling rate of $Lf_{ck}$, as also indicated in FIG. 2. Then, the feedforward transfer function F(z) 222 is applied to the digital output 228 (or digital output 226 if there is no up-sampler) to generate a transformed digital signal which serves as a digital input 230, also clocked at a sampling rate of $Lf_{ck}$, provided to the feedforward DAC 206. In turn, the feedforward DAC 206 converts the digital input 230 provided thereto to an analog signal, thus generating a feedforward path analog output 214 based on the digital input 230.

The second path (i.e. the forward path) includes a forward, CT, transfer function, G(s), 208, as also shown in FIG. 2. Unlike the transfer function H(s) 108 used in conventional implementations described above, the forward transfer function G(s) 208 is selected in combination with the feedforward transfer function F(z), considerations for which selection are described in greater detail below. In the forward path, the CT analog transfer function G(s) 208 is applied to the CT analog input x(t) 202 to generate a forward path analog output 212.

A subtractor 210 then subtracts the output 212 of the forward transfer function G(s) 208 from the output, $x_q(t)$, 214 of the feedforward path to generate a residue signal, $x_r(t)$, 216. This residue signal may then be processed, e.g. filtered and amplified by an inter-stage residue amplifier, $AMP_1$, 218, and the processed residue signal 220 may be provided to subsequent stages in an ADC (not specifically shown in FIG. 2).

As the foregoing description illustrates, there are several differences between the conventional implementation of a residue generation system as described with reference to FIG. 1A and a proposed improved implementation of a residue generation system as described with reference to FIG. 2. One difference is that the CT transfer function G(s) 208 in the forward path in FIG. 2 may be different from the one (H(s)) in FIG. 1A. Another difference is that, in the feedforward quantizer path, the $f_{ck}$-rate output data from the ADC 204 is input to the up-sampler 224 that up-samples and interpolates the digital data 226 by L (L≥1∈ℤ) times, e.g. by inserting (L−1) zeros between every two consecutive samples, to a rate of $Lf_{ck}$. The up-sampled output 228 is then processed by a feedforward transfer function F(z) 222, whose output 230 is converted to analog form using the DAC 206 clocked at $Lf_{ck}$. The DAC's output is then connected to the negative input terminal of the subtractor 210. Yet another difference is that, in conventional implementations, the CT transfer function in the forward path was restricted to an analog delay and F(z) was absent (or equal to 1). In contrast, embodiments of the present disclosure allow both to be arbitrary. Their choice can be made such that the residue signal 216 produced at the subtractor output is mostly, or entirely, only the in-band quantization error, and hence minimized, as described in greater detail next.

Figure 3:
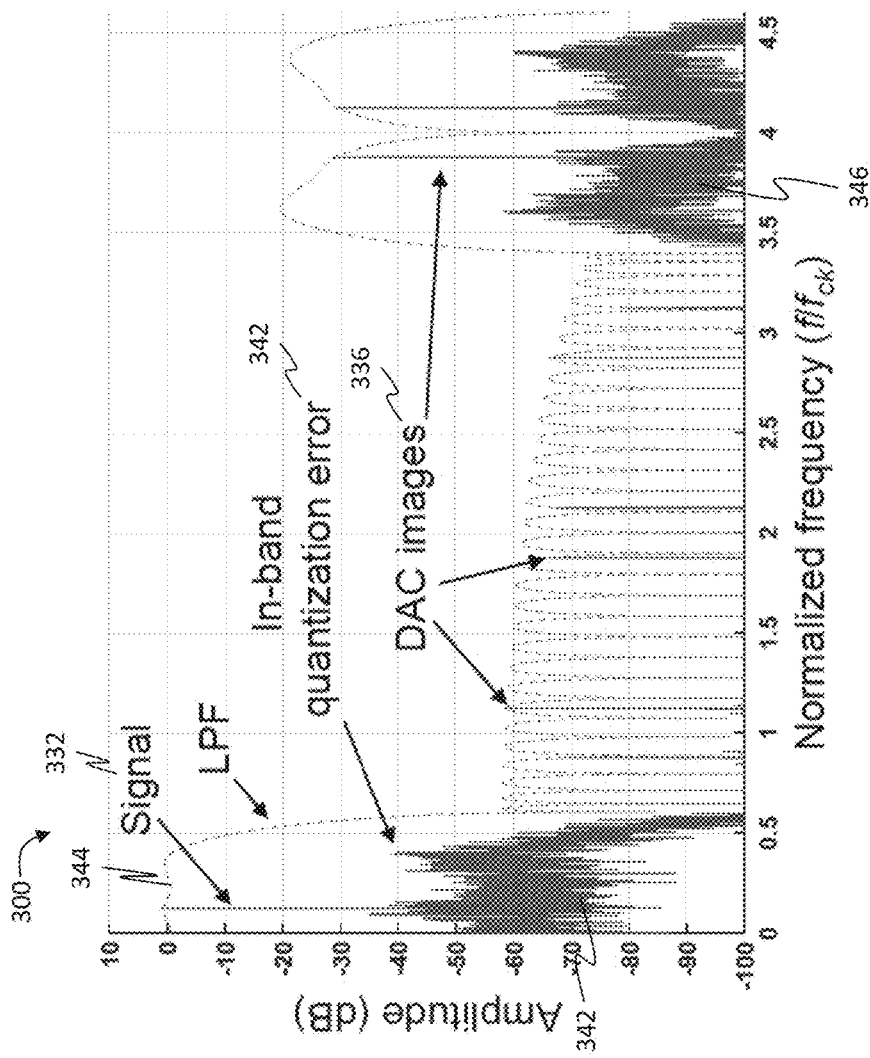
FIG. 3 is an illustration of an exemplary DAC output spectrum for the system of FIG. 2, according to some embodiments of the present disclosure.

According to various embodiments of the present disclosure, a combination of the first and second transfer functions (i.e. the feedforward path transfer function and the forward path transfer function) is selected so that, when both are applied, the analog input (i.e. the signal component x(t) 202), one or more aliases produced in the quantizer ADC 204, and out-of-band quantization error are substantially rejected from the residue signal 216 generated by the subtractor 210. In other words, the feedforward path transfer function and the forward path transfer function are chosen in combination so that signal components of the analog input x(t) 202 in the feedforward path analog output 214 and in the forward path analog output 212 are phase- and magnitude-aligned at their respective inputs to the subtractor 210, so that when the subtractor 210 generates the residue signal 216, they can be canceled (i.e. rejected from the residue signal 216). The aliases produced by the quantizer 204 and the out-of-band quantization error, in at least a certain frequency range directly following the in-band frequency range may also be canceled to some extent, e.g. in the frequency range from 0.5 to $3.5f/f_{ck}$ as shown in FIG. 3 providing an illustration of an exemplary DAC output spectrum 300 for the residue generation system 200 of FIG. 2, according to some embodiments of the present disclosure. As a result, as shown in the output spectrum 300 of exemplary FIG. 3, what may remain in the residue signal 216 is the in-band quantization error 342 (demarcated in FIG. 3 through the non-ideal LPF magnitude response 344, also shown in FIG. 3), high-frequency quantizer aliases which emerge as DAC output images 336, and high-frequency out-of-band quantization error 346 (where, as used herein, the term "high-frequency" refers to frequencies which are higher than half of the clock frequency $f_{ck}$ of the quantizer 204). The high-frequency components of such a residue signal, i.e. the DAC images 336 and the high-frequency out-of-band quantization error 346 shown in FIG. 3, may be easily rejected with a component following the subtractor, e.g. a band-limiting amplifier 218, shown in FIG. 2, used to amplify the residue signal 216, leaving, substantially, only the in-band quantization error 342 in the residue signal 220 that is passed to further stages of the ADC (such further stages are not specifically shown in FIG. 2).

Choosing the feedforward path transfer function 222 and the forward path transfer function 208 "in combination" means that selection of one of these transfer functions dictates what the other transfer function should be. For example, the feedforward path transfer function 222 may be any arbitrary transfer function, as long as the transfer function 208 in the forward path of the residue generation system 200 is chosen so that, when applied together, signal components, aliases, and out-of-band quantization error are substantially rejected in the residue signal. For example, in some embodiments, the feedforward path transfer function 222 may be chosen to reject the aliases and out-of-band quantization error. The forward path transfer function 208 may then be chosen to ensure that the signal components at the subtractor input from the forward path phase- and magnitude-align with the signal components at the subtractor input from the feedforward path. In various embodiments, the exact degree of rejection would then depend on the nature of the transfer functions 208, 222 selected for the two paths.

Examples of realizing reduction of the residue signal in both cases, i.e. a first case where, for a given (e.g. any arbitrary) F(z), G(s) is selected accordingly, and a second case where, for a given (e.g. any arbitrary) G(s), F(z) is selected accordingly, will now be described.

Case I—for a Given F(z), G(s) is Selected Accordingly

In some embodiments, the feedforward transfer function F(z) can be a DT digital transfer function of an ideal LPF, whose magnitude response is shown in FIG. 1C and can be described as $$F(f) = \begin{cases} L, & |f| \le 1/2L \\ 0, & 1/2L < |f| < 1/2 \end{cases}$$

Such a filter would reject all components, including DAC images and high-frequency quantization error, beyond $f_{ck}/2$ and up to $(L-0.5)f_{ck}$ in the DAC output spectrum.

The forward transfer function G(s) can then be selected to be an appropriate analog delay that phase-aligns the signal components of the forward path analog output 212 and the feedforward path analog output 214 in the subtractor 210 inputs, which would ensure their cancellation. In such a case, what may remain at the residue output 216 then is only the in-band quantization error and high-frequency DAC images, e.g. DAC images beyond $Lf_{ck}$. The latter can be easily rejected by the inter-stage residue amplifier, e.g. the amplifier 218, which may be selected as low-pass in nature.

As a person of ordinary skill in the art will realize, it may not be practical to try to implement an ideal LPF as the feedforward transfer function F(z). However, an implementation that approximates it may be feasible, especially given the digital nature of F(z). As an example, the residue generation system such as the system 200 shown in FIG. 2 may be considered with the up-sampler 224 being an up-sampler with L=4 and with the feedforward transfer function F(z) 222 being implemented as a $39^{th}$-order digital finite impulse response (FIR) LPF with a tap delay of $1/4f_{ck}$. In such an example, the output 230 of the FIR LPF filter implementing the feedforward transfer function F(z) 222 could be fed to the DAC 206 implemented as an NRZ DAC clocked at $4f_{ck}$ (i.e. DAC output pulses last for a duration of $1/4f_{ck}$). For this case, FIG. 3 illustrates the spectrum 300 of the DAC output (i.e. the solid line) along with the magnitude response 344 (i.e. the dashed line) of the resulting filter. FIG. 3 illustrates that application of the feedforward transfer function F(z) 222 implemented as a FIR LPF substantially filters spectral components from $f_{ck}/2$ to about $3.5f_{ck}$, while leaving the signal 332 and in-band quantization error 342 components substantially intact. Stronger DAC images 336 appear directly at about $4f_{ck}$ and its integer multiples, as can also be observed in FIG. 3. As they occur at very high frequencies, they can be easily rejected further by the band-limiting the amplifier 218, $AMP_1$, shown in FIG. 2. The subsequent stages then only need to handle the in-band quantization error, since the signal component 332 will be cancelled in the subtractor 210.

The sharp roll-off of the FIR LPF filter implementing the feedforward transfer function F(z) 222 may be able to suppress DAC images 336 which are close to the signal band sufficiently. As a result, the input frequency that the system 200 can handle can be increased, even going close to $f_{ck}/2$ (i.e. OSR=1). Conversely, for a given input bandwidth, the frequency of the clock to the quantizer 204 shown in FIG. 2 can be lowered, thereby also lowering the output digital data rate. This may also lower the power dissipation in the backend digital processing circuits, and, additionally, may also lower the power dissipation in analog switching blocks such as e.g. clock generators, buffers, and comparators, and will relax the unity gain bandwidth requirement of the inter-stage residue amplifier 218, $AMP_1$.

Case II—for a Given G(s), F(z) is Selected Accordingly

The previous case described the possibility of an arbitrary transfer function F(z) in the feedforward path of the residue generation system 200. This case describes the choice of an appropriate transfer function, G(s), for the forward path. In some embodiments, G(s) may be chosen so that the in-band signal component of the input x(t) 202 is completely eliminated in the residue signal $x_r(t)$ 216 at the output of the subtractor 210 and the out-of-band components may then be attenuated in the inter-stage amplifier 218, $AMP_1$. In the feedforward path, the stage input x(t) 202 may go through the transfer functions of the quantizer 204 (which, ignoring the aliasing and quantization error, is typically a delay), the feedforward transfer function F(z) 222, and the DAC 206 (which for an NRZ DAC would be a sinc roll-off with a delay). In the forward path, then, ideally, the input signal x(t) 202 should go through substantially the same transfer functions, so that when the outputs of the forward and feedforward paths are subtracted in the subtractor 210, the residue output $x_r(t)$ 216 does not contain any in-band signal component of the analog input signal x(t). This can happen only if the forward path transfer function G(s) matches the feedforward path transfer functions mentioned above (i.e. those for the quantizer, F(z), and the DAC) at least in the input signal bandwidth (the out-of-band components that may remain in the residue signal 216 could then be attenuated in the inter-stage amplifier 218, $AMP_1$).

In the case of conventional residue generation systems such as the one described above, the transfer function in the forward path, G(s), is one of an all-pass filter, implementing a CT analog delay. In contrast, embodiments of the present disclosure allow using other transfer functions in the forward path. For example, in some embodiments, the forward path transfer function G(s) could be a low-pass filter that can match the sinc roll-off in the NRZ DAC implementing the DAC 206, while ensuring a certain in-band group-delay characteristic to guarantee phase alignment of the in-band signal components at the subtractor inputs. In the presence of F(z), any additional delay or in-band roll-off in the magnitude response can also be compensated by suitably adjusting G(s) with the goal of eliminating, minimizing, or at least reducing, the in-band signal components of x(t) in the output residue signal 216.

Next, some exemplary specific implementations with special cases which may be interesting from a practical point of view will be described, according to various embodiments of the present disclosure.

Exemplary Implementation 1—F(z) as a General DT FIR Filter with Set Tap Delay

Figure 4A:
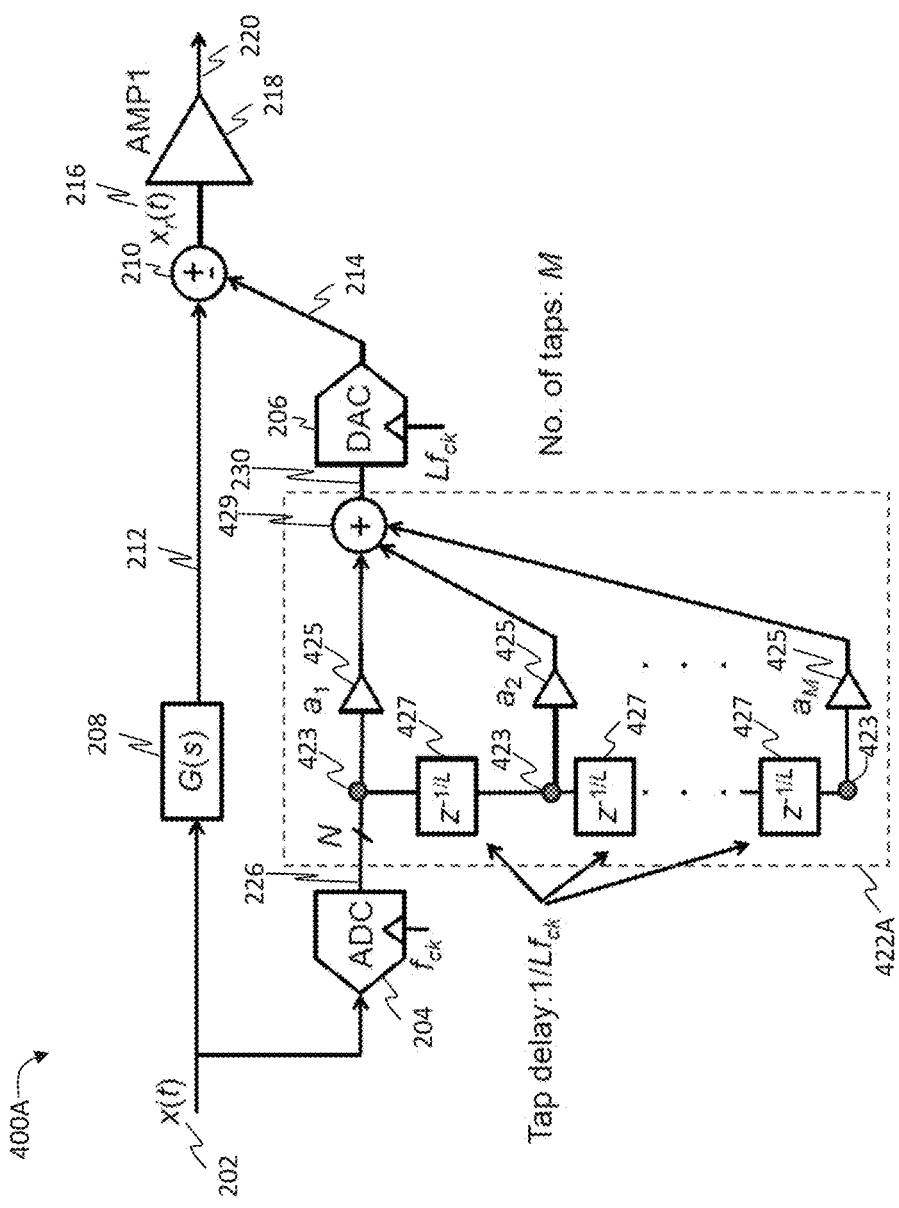
FIG. 4A is an illustrative system diagram of a residue generation system of FIG. 2 with F(z) implemented as a general M-tap discrete-time FIR filter with a tap delay of $1/L \cdot f_{ck}$ followed by a DAC, according to some embodiments of the present disclosure.

An exemplary case where the feedforward path transfer function F(z) 222 is implemented as a low-pass DT FIR filter was described above, and illustrated in FIG. 3. FIG. 4A is an illustrative system diagram of a residue generation system 400A, which could be an example of the residue generation system 200 shown in FIG. 2, with F(z) 222 implemented as such a low-pass DT FIR filter, according to some embodiments of the present disclosure. In particular, FIG. 4A illustrates that the feedforward path transfer function F(z) 222 is implemented as an M-tap discrete-time FIR filter 422A (where M is an integer greater than or equal to 1) with a tap delay of $1/L \cdot f_{ck}$ followed by the DAC 206. It should be noted that reference numerals in FIG. 4A which are the same as those used in FIG. 2 are intended to illustrate similar, analogous, or the same elements as those described with reference to FIG. 2, so that, in the interests of brevity, their descriptions do not have to be repeated with reference to FIG. 4A and only differences between these FIGURES can be described. This holds for FIG. 4B as well.

As is shown in FIG. 4A, in some implementations, N-bit $f_{ck}$-rate ADC output data, which is an example of the quantizer output digital signal 226 shown in FIG. 2, is fed into the M-tap delay line 422A with a tap delay of $1/L f_{ck}$. Thus, in the exemplary implementation shown in FIG. 4A, a delay between any two consecutive taps 423 (i.e. a tap delay) of the M taps 423 is $1/L \cdot f_{ck}$, where each tap 423 is a point of intersection from which a line is drawn to the input of a corresponding multiplier 425 associated, in one-to-one correspondence (i.e. each multiplier 425 is associated with a different one of the M taps 423), with that tap. As can be seen from FIG. 4A, each tap delay is shown as a tap delay $Z^{-1/L}$ 427 and M taps 423 will need M−1 delays 427. As further shown in FIG. 4A, an output of each tap 423 of the M taps is multiplied, using the associated one of the M multipliers 425, by a respective tap coefficient $a_i$ of the multiplier 425, where i is an integer between 1 and M, and outputs of the M multipliers 425 are summed by an adder 429 to generate the $L f_{ck}$-rate FIR filter output from the FIR filter 422A, which filter output is an example of the digital input 230 to the DAC 206 shown in FIG. 2. The digital input 230 is then provided to the DAC 206, as also shown in FIG. 4A.

Figure 4B:
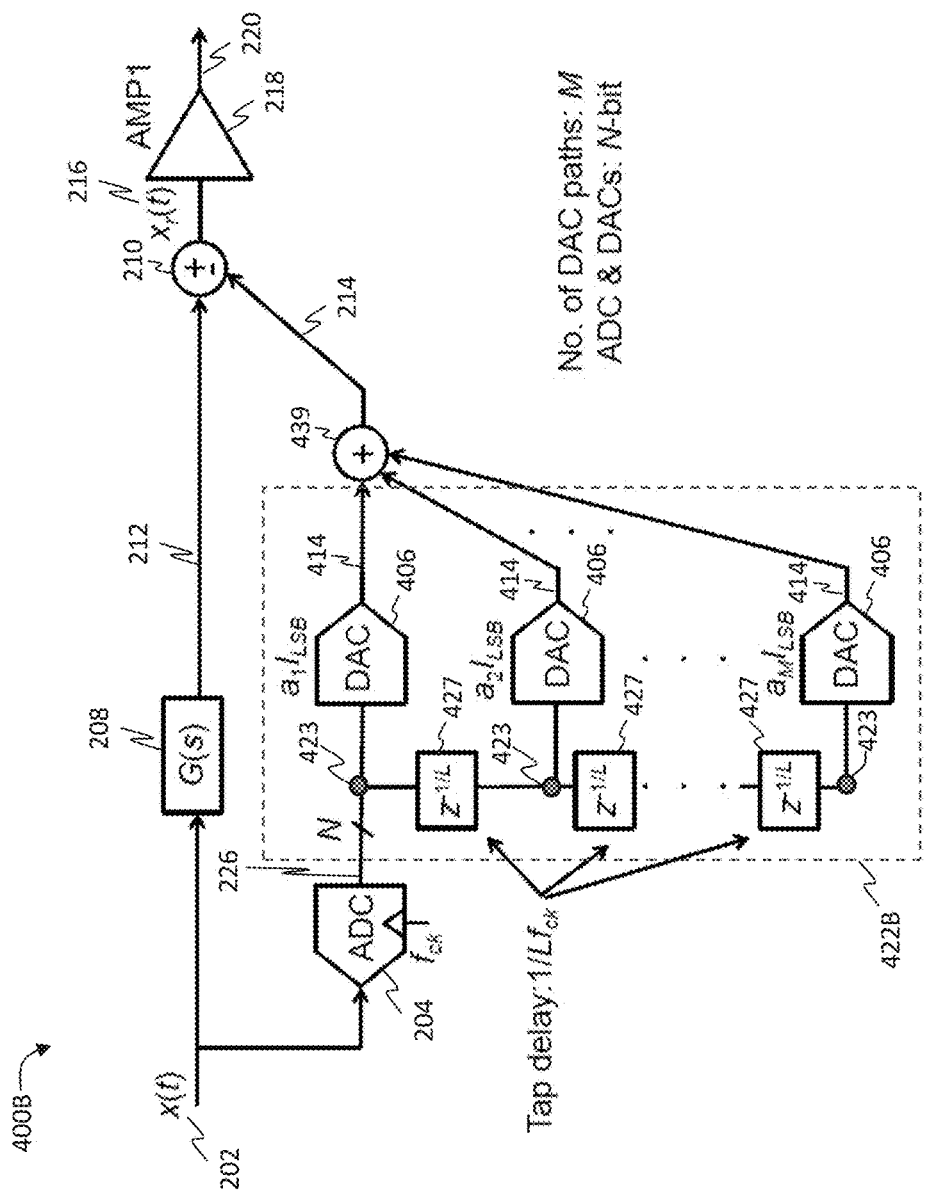
FIG. 4B is an illustrative system diagram of a residue generation system of FIG. 2 with F(z) implemented as a general M-tap discrete-time FIR filter with a tap delay of $1/L \cdot f_{ck}$ with the DAC merged with the multipliers, according to some embodiments of the present disclosure.

Exemplary Implementation 2—F(z) as a General DT FIR Filter with Merged DAC with Set Tap Delay Another exemplary case where the feedforward path transfer function F(z) 222 is implemented as a low-pass DT FIR filter is shown in FIG. 4B. FIG. 4B is an illustrative system diagram of a residue generation system 400B, which could be another example of the residue generation system 200 shown in FIG. 2. The system 400B of FIG. 4B is similar to the system 400A of FIG. 4A, illustrating that the feedforward path transfer function F(z) 222 of FIG. 2 is implemented as an M-tap discrete-time FIR filter 422B. The main difference between FIGS. 4A and 4B is that, in FIG. 4B, the DAC 206 which was shown in FIG. 4A is now merged with the FIR coefficient multipliers 425 of FIG. 4A, necessitating M DACs 406 as shown in FIG. 4B, each of which performs the multiplication function of the respective multipliers 425 of FIG. 4A, besides the digital-to-analog conversion function. In some embodiments, all of the M DACs 406 may have the same resolutions (N bits), but their least-significant-bits (LSBs) and, hence, their full scales, vary in proportion with the coefficient value, $a_i$, implemented in each DAC. In this case, the input to the DAC 406 in any path (i.e. from any tap 423) is clocked at $f_{ck}$-rate. Therefore, each of the DACs 406 are clocked at $f_{ck}$ and can be NRZ or return-to-zero (RZ). In the former case, they generate pulses that last for duration $1/f_{ck}$.

Thus, the digital FIR filter 422B shown in FIG. 4B may be seen as including a delay line comprising M taps 423, M DACs 406, and M multipliers, where each one of the M DACs 406 is merged with one of the multipliers (hence the multipliers are not individually shown in FIG. 4B), and where a full scale of each of the M DACs 406 is proportional to a tap coefficient $a_i$ of the respective FIR coefficient multiplier (e.g. one of the multipliers 425 shown in FIG. 4A) with which the DAC 406 is merged. Similar to FIG. 4A, for the residue generation system 400B shown in FIG. 4B, a delay between any two consecutive taps 423 is $1/L \cdot f_{ck}$. The outputs of the M DACs 406 (labeled in FIG. 4B as outputs 414) are then summed in an adder 439 to generate the feedforward path analog output 214 provided to the subtractor 210.

Figure 5A:
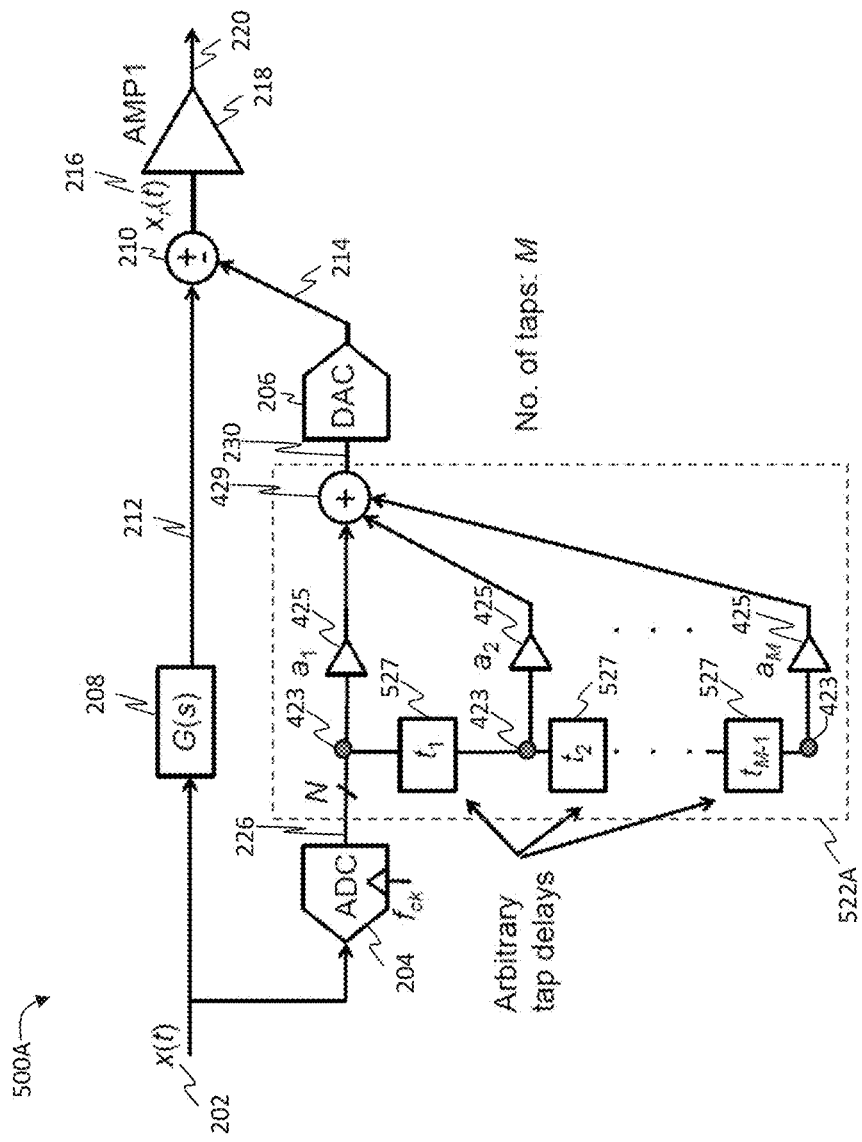
FIG. 5A is an illustrative system diagram of a residue generation system of FIG. 2 with F(z) implemented as a general M-tap FIR filter with different tap delays followed by a DAC, according to some embodiments of the present disclosure.

Exemplary Implementation 3—F(z) as a General DT FIR Filter with Arbitrary Tap Delays The residue generation systems 400A and 400B shown in FIGS. 4A and 4B, respectively, can be broadened to allow for arbitrary tap delays, $t_i$, which are not necessarily equal to one another. FIG. 5A illustrates a residue generation system 500A where the fixed tap delays 427 of $1/Lf_{ck}$ between each pair of consecutive taps 423 shown in FIG. 4A are replaced with non-equal tap delays 527, $t_i$.

It should be noted that reference numerals in FIG. 5A which are the same as those used in FIG. 2 or 4A are intended to illustrate similar, analogous, or the same elements as those described with reference to FIG. 2 or 4A, so that, in the interests of brevity, their descriptions do not have to be repeated with reference to FIG. 5A. This holds for FIG. 5B as well.

As is shown in FIG. 5A, in some implementations of a digital FIR filter 522A, an N-bit $f_{ck}$-rate ADC output data, which is an example of the quantizer output digital signal 226 shown in FIG. 2, is fed into the M-tap delay line 422A with an arbitrary tap delay of $t_i$. As can be seen from FIG. 5A, each tap delay is shown as a tap delay $t_1, t_2, \ldots, t_{M-1}$ 527 and M taps 423 will need M−1 delays 527. As in FIG. 5A, an output of each tap 423 of the M taps is multiplied, using the associated one of the M multipliers 425, by a respective tap coefficient $a_i$ of the multiplier 425, where i is an integer between 1 and M, and outputs of the M multipliers 425 are summed by an adder 429 to generate the $Lf_{ck}$-rate FIR filter output from the FIR filter 422A, which filter output is an example of the digital input 230 to the DAC 206 shown in FIG. 2. The digital input 230 is then provided to the DAC 206, as also shown in FIG. 5A.

Figure 5B:
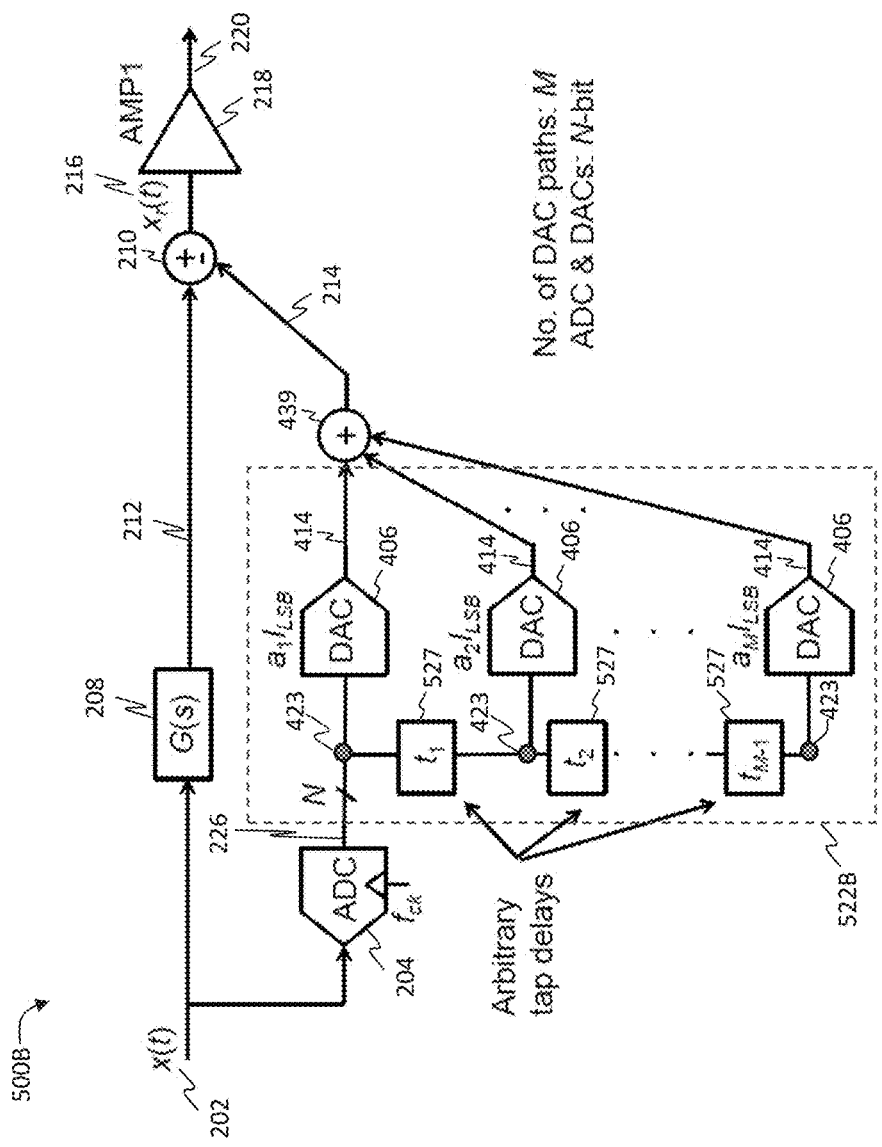
FIG. 5B is an illustrative system diagram of a residue generation system of FIG. 2 with F(z) implemented as a general M-tap FIR filter with different tap delays with the DAC merged with the multipliers, according to some embodiments of the present disclosure.

Exemplary Implementation 4—F(z) as a General DT FIR Filter with Merged DAC with Arbitrary Tap Delays FIG. 5B illustrates a residue generation system 500B with a digital FIR filter 522B where, similar to FIG. 5A, the fixed tap delays 427 of $1/Lf_{ck}$ between each pair of consecutive taps 423 shown in FIG. 4B are replaced with non-equal tap delays 527, $t_i$. The rest of the descriptions provided with reference to FIG. 4B are applicable to FIG. 5B and, therefore, in the interests of brevity, not repeated.

Exemplary Special Cases

To demonstrate the benefits of the proposed scheme in further detail, we now consider a special case of the systems in FIGS. 4A and 4B where all tap coefficients are equal, i.e. $a_i=1/M$. Assuming an NRZ DAC, it can be shown that the filter resulting in the feedforward path will have a frequency response given by $$F_M(f) = \frac{1}{M} \frac{\sin(M\pi f t_{offset})}{\sin(\pi f t_{offset})} \mathrm{sinc}(fT_{CK}) e^{-\frac{j2\pi f t_{offset}(M-1)}{2}},$$

where $t_{offset}=T_{ck}/L$ is the tap delay.

Figure 6:
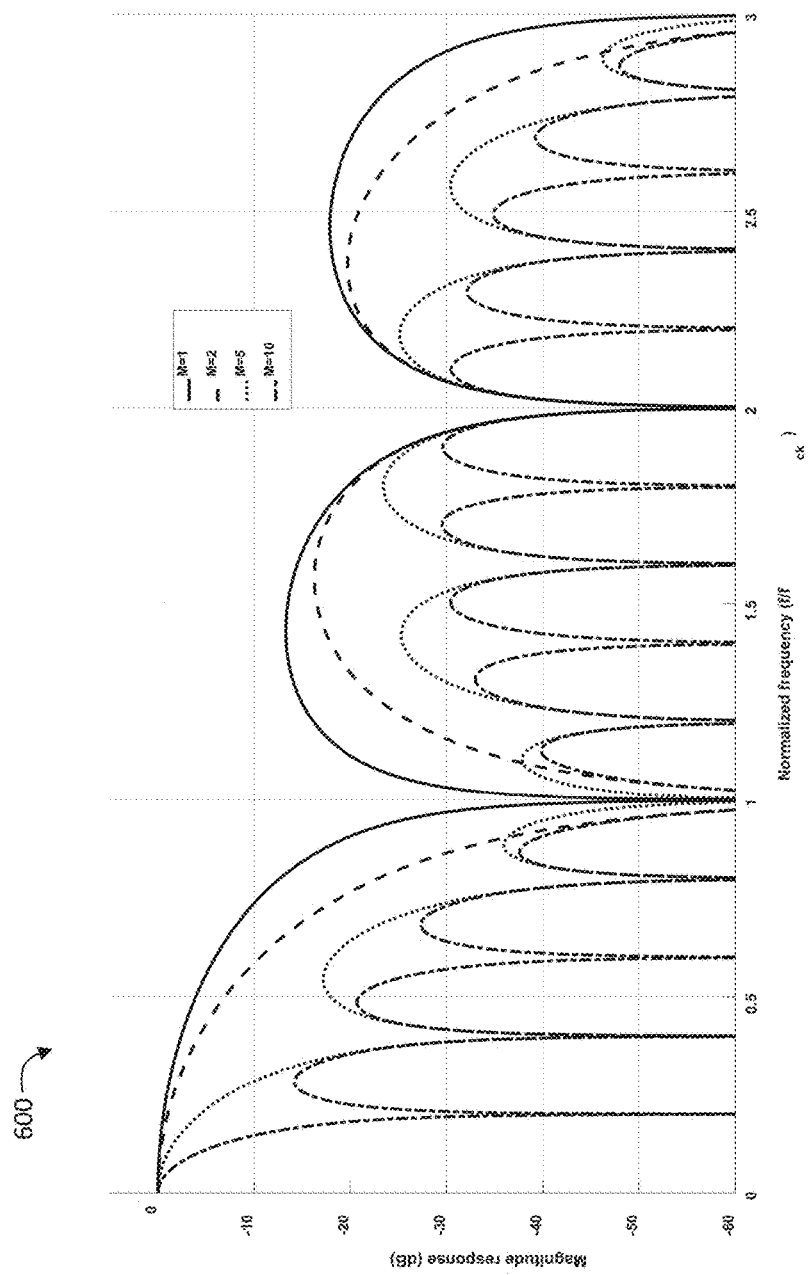
FIG. 6 is an illustration of a magnitude response of the filter in the feedforward path in the systems of FIGS. 4A and 4B for different values of M with L=2 and equal tap coefficients, $a_i=1/M$, according to some embodiments of the present disclosure.

The magnitude response of $F_M(f)$ has a maximum at DC, with a maximum value of 1. It has nulls at $nf_{ck}$ and $$\frac{1}{t_{offset}}\left(n \pm \frac{k}{M}\right),$$

where K is 1, 2, ... (M−1)/2 for odd M, and is 1, 2, ... M/2 for even M, for each $n \in \mathbb{Z}$. The magnitude response of the filter in the feedforward path for different values of M with L=2 (i.e. tap delay is $T_{ck}/2$) is shown in FIG. 6 as a magnitude response 600. The plot for M=1 matches that for the NRZ DAC of FIG. 1A. As the value M of increases, a sharper roll-off and additional zeros are seen, which may be used to further band-limit the DAC output. However, the in-band signal attenuation may also increase. In some implementations, M may be chosen based on the chosen OSR and desired attenuation.

In some implementations, the choice of M=2 (and L=2) may be appropriate in terms of maximizing image rejection while incurring minimal in-band signal attenuation. Furthermore, if based on the system in FIG. 4B with the merged DAC, the F(z)-DAC path may have a very simple implementation shown in FIG. 7A: two half-sized DACs 406 (in terms of LSB/full-scale relative to that of the DAC in FIG. 1A) with input data to one DAC offset in time relative to the other by half a clock cycle (as L=2) using the time delay element 427. This scenario will now be considered in further detail. From the resulting frequency response of the F(z)-DAC path, shown in FIG. 6 (for M=2), the minimum image rejection requirement of 17 dB can be satisfied for an input frequency as high as $f_{ck}/4$ (i.e. the filter attenuation above $f/f_{ck}=\frac{3}{4}$ is >17 dB). This is two times higher than the maximum input frequency that the residue generation block of FIG. 1A can handle ($f_{ck}/8$). The resulting output spectrum of the DAC for a single-tone input at frequency $f_{ck}/4$ is shown as a spectrum 730 in FIG. 7B, where the 17-dB attenuation of the image at $3f_{ck}/4$ is confirmed. The rejection of the DAC images around even integer multiples of $f_{ck}$ (e.g. $2f_{ck}$) may be comparable with that of the corresponding resulting images in the system of FIG. 1A. However, now they can be rejected by the inter-stage residue amplifier, which is generally low-pass in nature.

Therefore, it may be concluded that, in cases where the DAC images in the first Nyquist zone (i.e. around $f_{ck}$) result in a prohibitively high residue amplitude, the residue generation systems proposed herein can extend the input bandwidth by e.g. up to 2 times as compared to the conventional systems such as the one shown in FIG. 1A for a given a sampling rate. Conversely, for a given input bandwidth, $f_{BW}$, it may allow the sampling rate, $f_{ck}$, to be lowered by e.g. up to 2 times. This may, in turn, lower the output data rate of the system by the same factor, thereby allowing a proportional lowering of the power dissipation in the backend digital processing blocks. As described before, it may also lower the power dissipation in analog switching blocks like clock generators and buffers and comparators, and may relax the unity gain bandwidth requirement of the inter-stage amplifier 218, $\mathrm{AMP}_1$.

Figure 7A:
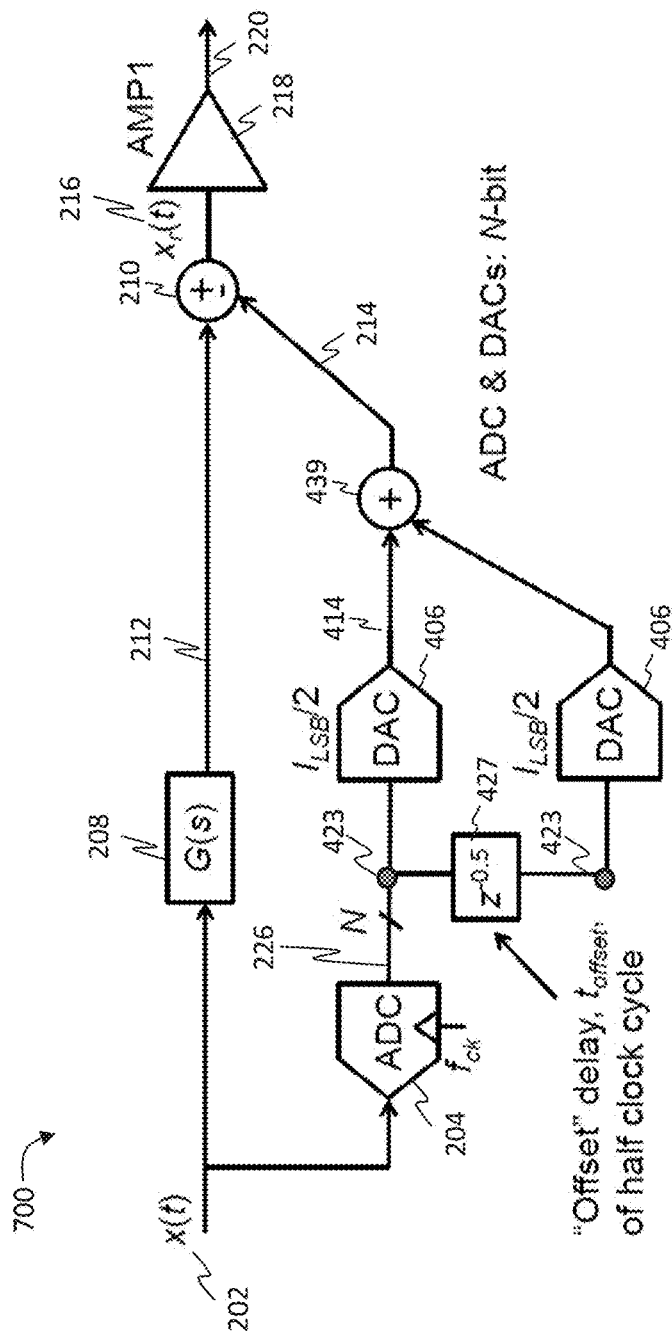
FIG. 7A is an illustrative system diagram of an exemplary implementation of the residue generation system of FIG. 4B with M=2, L=2, and $a_i=\frac{1}{2}$, according to some embodiments of the present disclosure.
Figure 7B:
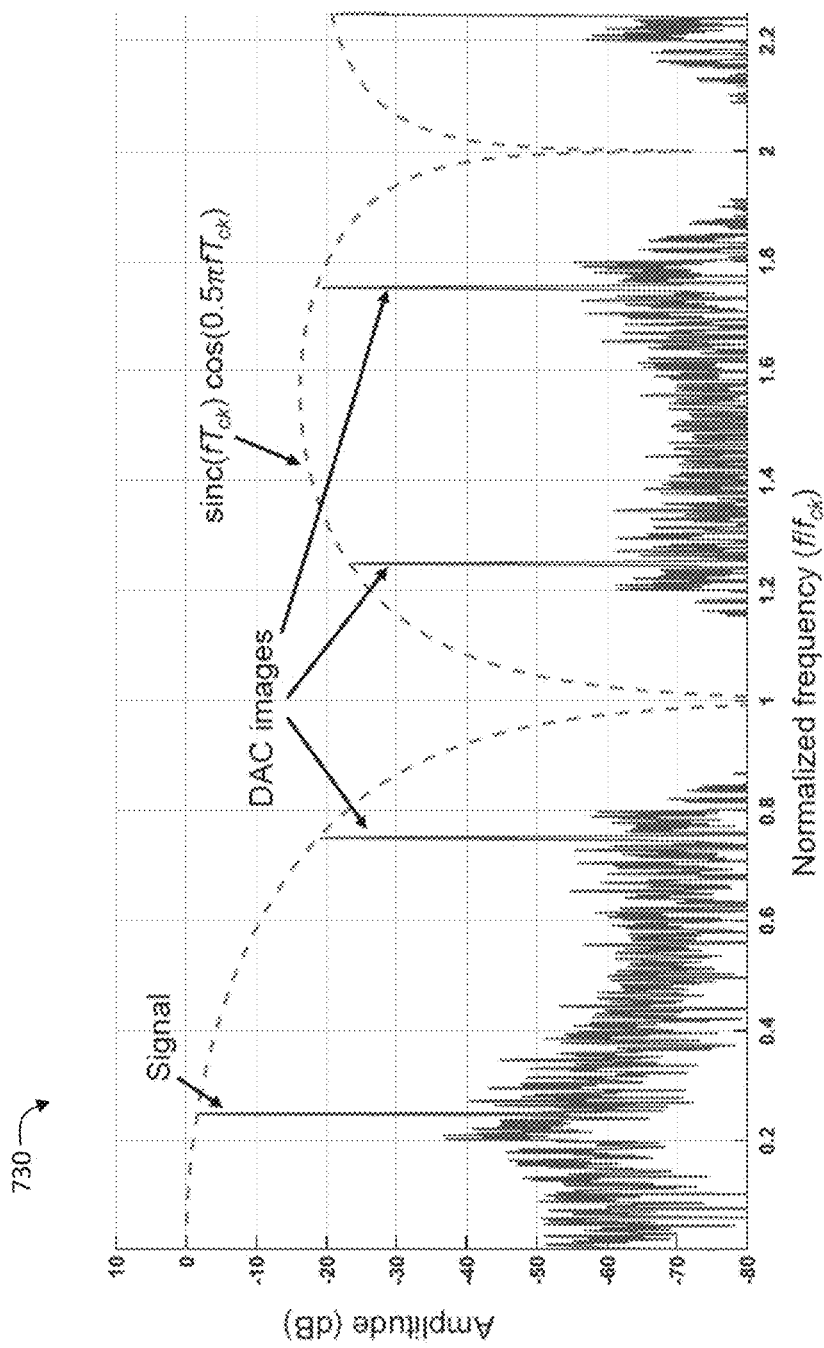
FIG. 7B is an illustration of a spectrum of the sum of the DAC outputs in the system of FIG. 7A when triggered with a single-tone input at frequency $f_{ck}/4$, along with the shaping filter, according to some embodiments of the present disclosure.
Figure 8A:
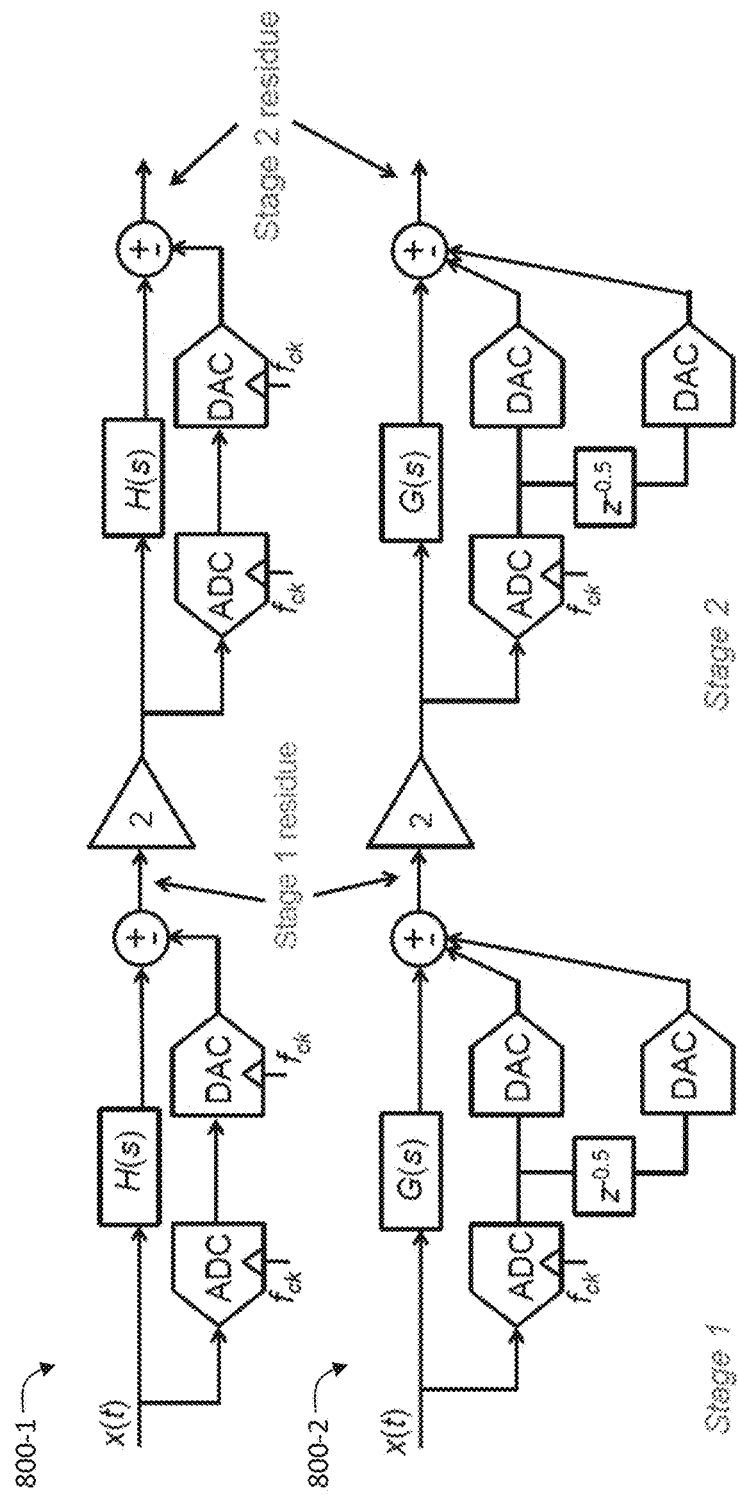
FIG. 8A provides an illustration of a two-stage cascade of residue generation systems according to FIG. 1 (upper illustration) and according to FIG. 7A, according to some embodiments of the present disclosure.
Figure 8B:
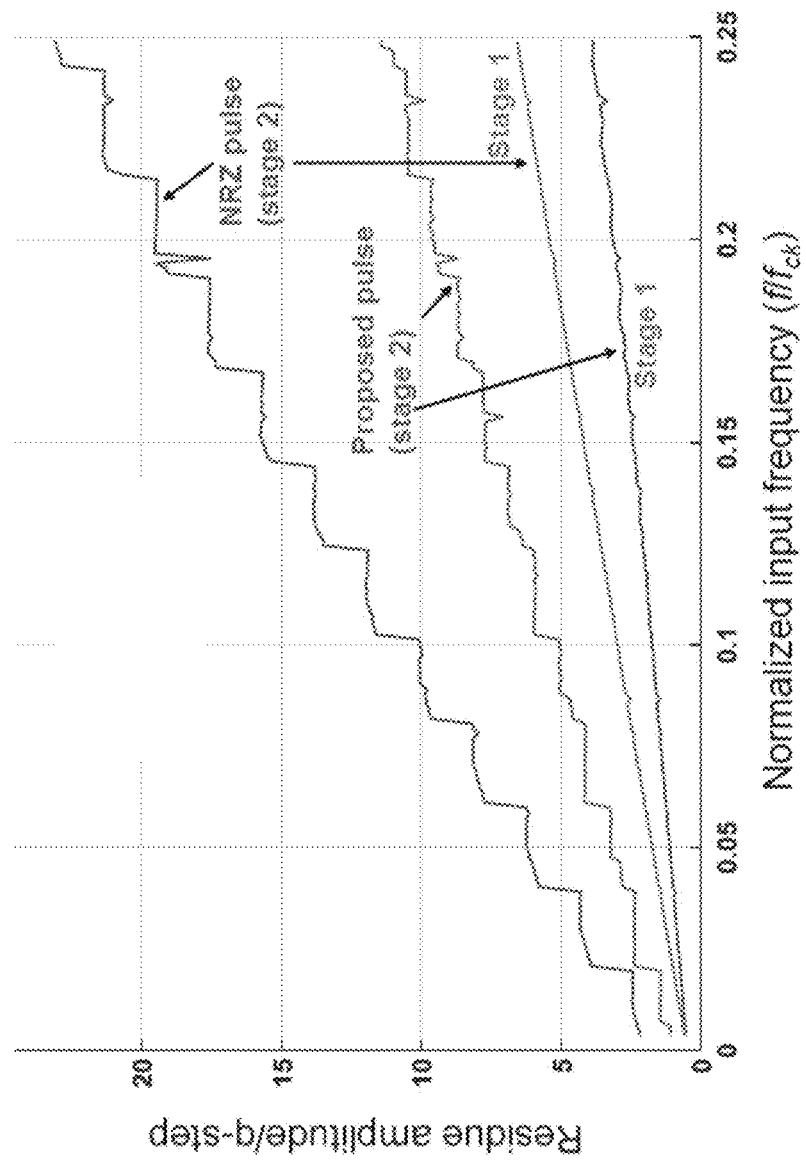
FIG. 8B provides an illustration of the residue amplitude normalized to the quantization step versus normalized input frequency for each stage of the two systems shown in FIG. 8A, according to some embodiments of the present disclosure.

To compare residue amplitudes in a chain, an example of two residue generation stages cascaded with a broadband inter-stage gain of 2 can be considered. FIG. 8A provides a comparison of two such systems—a system 800-1 using two stages of the conventional residue generation block of FIG. 1A (upper illustration in FIG. 8A), and a system 800-2 using two stages of the residue generation block as shown in FIG. 7A (lower illustration in FIG. 8A). The amplitudes of the residues at the outputs of the two stages were measured in a simulation where the frequency of a full-scale single-tone input was swept. Their plot (as a fraction of the quantization step) against the input frequency is shown in FIG. 8B. As can be seen in FIG. 8B, for a given stage and input frequency, the residue amplitude in the proposed system an example of which is represented with the system 800-2 is always lower than that in the conventional system 800-1 with the NRZ pulse.

Exemplary Method for Generating a Residue Signal

Figure 9:
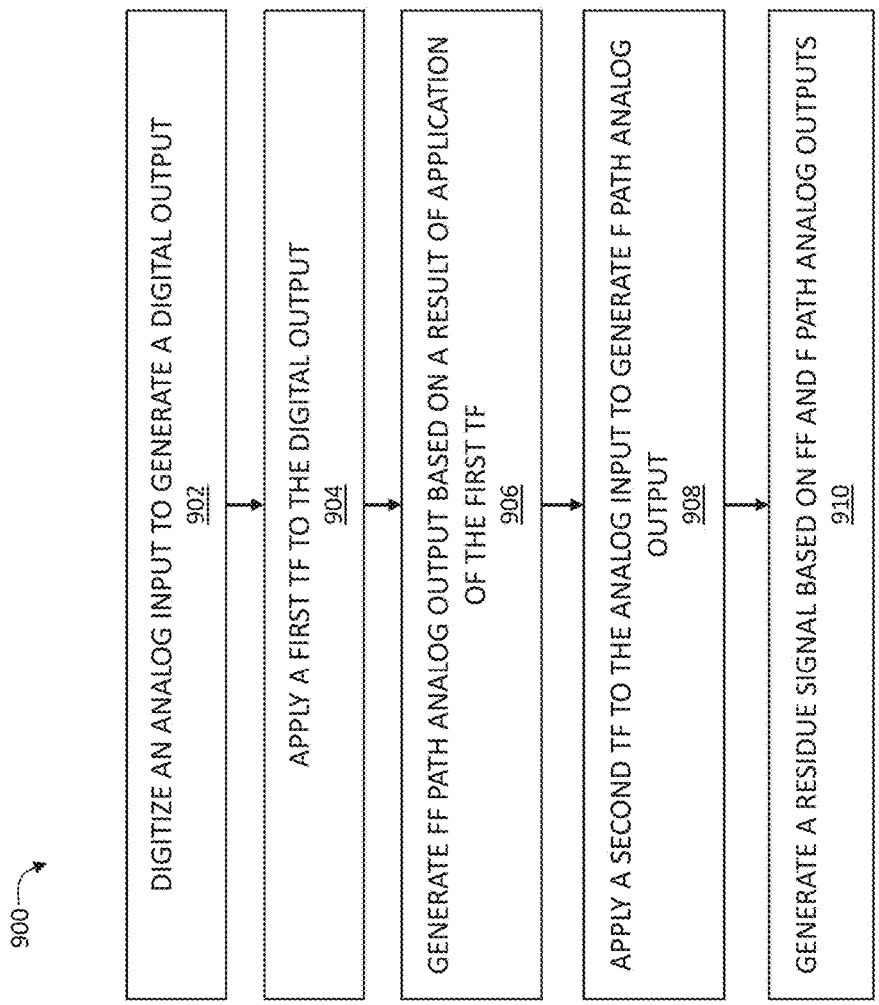
FIG. 9 is a flow diagram illustrating a method for generating a residue signal, according to some embodiments of the present disclosure.

FIG. 9 is a flow diagram illustrating a method 900 for generating a residue signal, according to some embodiments of the present disclosure. The method may be used for any residue-generating ADC implementing at least one stage with a CT forward path transfer function and a feedforward path transfer function selected in combination, as described herein. The method outlined is described for a particular residue generation element/system. It is envisioned by the disclosure that the same method can be applied to other residue generation systems which may be present within the ADC, e.g. to residue generation systems in other stages of conversion, to reduce the amplitude of the residue signal passed to further stages.

Turning first to the feedforward path, in 902, a quantizer in the feedforward path digitizes the analog input provided thereto to generate a digital output. In 904, a feedforward path transfer function is applied to the digital output generated by the quantizer in 902. In 906, a feedforward path analog output is generated based on the result of the application of the feedforward transfer function applied in 904.

Turning now to the forward path, in 908 (which can take place before, after, or at least partially simultaneously with any one of 902, 904 and 906), a CT forward path transfer function is applied to the analog input provided thereto to generate a forward path analog output. In 910, a residue signal is generated based on the feedforward path analog output generated in 906 and the forward path analog output generated in 908. As explained above, the forward path transfer function and the feedforward path transfer function are selected in combination to reduce the final residue signal.

Exemplary Residue Generating Apparatus

In some embodiments, the apparatus may include a first stage comprising at least a residue generating circuit or system configured to generate a residue signal, and a second stage configured to process the residue signal received from the first stage. The residue signal of the first stage may be injected into the second stage for further processing there. For example, the residue signal may be digitized by the second stage.

The residue generating circuit of the first stage may include means for digitizing an analog input to generate a digital output. Examples of such means include quantizers described herein. The circuit may further include means for applying a first transfer function to the digital output from the means for digitizing the analog input. Examples of means for applying the first transfer function include filters as described herein, e.g. the DT FIR filters shown in FIGS. 4A-4B, 5A-5B, and 7A. The circuit may further include means for generating a feedforward path analog output based on the result of applying the first transfer function to the digital output provided thereto. Examples of such means include DACs described herein, e.g. the DACs shown in FIGS. 4A-4B, 5A-5B, and 7A. The circuit may also include means for applying a second, continuous-time, transfer function to the analog input provided to the means for digitizing an analog input to generate a forward path analog output. Examples of such means for applying the second transfer function include filters as described herein, e.g. the filters shown in FIGS. 4A-4B, 5A-5B, and 7A. The circuit may also include means for generating a residue signal based on a difference between the forward path analog output and the feedforward path analog output. Examples of such means include subtractors described herein, e.g. the subtractors shown in FIGS. 4A-4B, 5A-5B, and 7A. The first stage may further include means for amplifying and/or filtering the residue signal before it is provided to the second stage. Examples of such means include inter-stage amplifiers described herein, e.g. the amplifiers shown in FIGS. 4A-4B, 5A-5B, and 7A.

The apparatus can be a CT or a hybrid ADC, implementing at least one residue generating stage (e.g., as shown in FIGS. 2, 4A-4B, 5A-5B, 7A, and 8A).

SELECT EXAMPLES

Example 1 provides a residue generation system for use in a continuous-time stage of an ADC. The apparatus includes a quantizer for digitizing an analog input to generate a digital output; means for applying a first transfer function (F) to the digital output from the quantizer to generate a digital input to a feedforward DAC; the feedforward DAC for generating a feedforward path analog output based on the digital input provided thereto; means for applying a second, continuous-time, transfer function (G) to the analog input provided to the quantizer to generate a forward path analog output; and a subtractor for generating a residue signal based on a difference between the forward path analog output and the feedforward path analog output.

Example 2 provides the residue generation system according to Example 1, where a combination of the first and second transfer functions is selected so that, when both are applied, the analog input (i.e. the signal component x), one or more aliases produced in the quantizer, and an out-of-band quantization error are substantially rejected from the residue signal.

Example 3 provides the residue generation system according to Examples 1 or 2, where the means for applying the first transfer function includes means for up-sampling the digital output from the quantizer by an up-sampling factor L, where L is an integer greater than 1.

Example 4 provides the residue generation system according to Example 3, where a clock frequency of the digital output from the quantizer is $f_{ck}$, and a clock frequency of the digital input to the feedforward DAC is $L \cdot f_{ck}$.

Example 5 provides the residue generation system according to Examples 3 or 4, where the means for applying the first transfer function further includes a digital finite impulse response (FIR) filter.

Example 6 provides the residue generation system according to Example 5, where the FIR filter has a tap delay of $1/L \cdot f_{ck}$.

Example 7 provides the residue generation system according to Example 6, where the digital FIR filter includes a delay line including M taps and M multipliers, each one of the M multipliers associated with a respective different one of the M taps, where M is an integer greater than or equal to 1, a delay between any two consecutive taps of the M taps is $1/L \cdot f_{ck}$, an output of each tap of the M taps is multiplied, using the associated one of the M multipliers, by a respective tap coefficient $a_i$ of the multiplier, where i is an integer between 1 and M, and outputs of the M multipliers are summed to generate the digital input provided to the feedforward DAC.

Example 8 provides the residue generation system according to Example 5, where the digital FIR filter includes a delay line including M taps and M multipliers, each one of the M multipliers associated with a respective different one of the M taps, where M is an integer greater than or equal to 1, a delay between at least one pair of two consecutive taps of the M taps is different from a delay between at least one other pair of two consecutive taps of the M taps, an output of each tap of the M taps is multiplied, using the associated one of the M multipliers, by a respective tap coefficient $a_i$ of the multiplier, where i is an integer between 1 and M, and outputs of the M multipliers are summed to generate the digital input provided to the feedforward DAC.

Example 9 provides the residue generation system according to Example 6, where the digital FIR filter includes a delay line including M taps and M multipliers, each one of the M multipliers associated with a respective different one of the M taps, where M is an integer greater than or equal to 1, a delay between any two consecutive taps of the M taps is $1/L \cdot f_{ck}$, the feedforward DAC includes M DACs, where each one of the M DACs is merged with one of the M multipliers and where a full scale of each of the M DACs is proportional to a tap coefficient $a_i$ of the respective FIR coefficient multiplier with which the DAC is merged, and outputs of the M DACs are summed to generate the feedforward path analog output provided to the subtractor.

Example 10 provides the residue generation system according to Example 5, where the digital FIR filter includes a delay line including M taps and M multipliers, each one of the M multipliers associated with a respective different one of the M taps, where M is an integer greater than or equal to 1, a delay between at least one pair of two consecutive taps of the M taps is different from a delay between at least one other pair of two consecutive taps of the M taps, the feedforward DAC includes M DACs, where each one of the M DACs is merged with one of the M multipliers and where a full scale of each of the M DACs is proportional to a tap coefficient $a_i$ of the respective FIR coefficient multiplier with which the DAC is merged, and outputs of the M DACs are summed to generate the feedforward path analog output provided to the subtractor.

Example 11 provides the residue generation system according to any one of Examples 3-10, further including means for rejecting (i.e. filtering out) DAC images at a frequency $L \cdot f_{ck}$, and DAC images at a frequency $K \cdot L \cdot f_{ck}$, where K is an integer greater than 1 (i.e. DAC images at integer multiples of the frequency $L \cdot f_{ck}$).

Example 12 provides the residue generation system according to Example 11, further including means for rejecting (i.e. filtering out) out-of-band quantization error at a frequency range of $L \cdot f_{ck} - 0.5 \cdot f_{ck}$ to $L \cdot f_{ck} + 0.5 \cdot f_{ck}$, and out-of-band quantization error at a frequency range of $K \cdot L \cdot f_{ck} - 0.5 \cdot f_{ck}$ to $K \cdot L \cdot f_{ck} + 0.5 \cdot f_{ck}$. As a result of rejecting the high-frequency DAC images and possibly also the high-frequency out-of-band quantization error, something which may be done with a band-limiting amplifier that receives the residue signal generated by the subtractor, residue signal passed to the subsequent stages of an ADC now contains substantially only the in-band quantization error.

Example 13 provides the residue generation system according to any one of Examples 1-12, where the means for applying the second transfer function includes means for applying an analog delay to phase-align signal components of the forward path analog output and of the feedforward path analog output so that, when both the first and second transfer functions are applied, at least some of the signal components are substantially canceled out of the residue signal.

Example 14 provides the residue generation system according to any one of Examples 1-12, where the means for applying the second transfer function includes a filter matching the first transfer function (i.e. matching the transfer function implemented within the feedforward path, e.g. matching the sinc roll-off in the NRZ DAC), ensuring that signal components of the forward path analog output and the feedforward path analog output are phase- and magnitude-aligned so that, when both the first and second transfer functions are applied, at least some of the signal components are substantially canceled out of the residue signal.

Example 15 provides the residue generation system according to any one of the preceding Examples, where the system is a residue generator in a continuous-time or a hybrid ADC.

Example 16 provides the residue generation system according to any one of Examples 1-15, where the first transfer function is a discrete-time transfer function.

Example 17 provides the residue generation system according to any one of Examples 1-15, where the first transfer function is a continuous-time transfer function.

Example 18 provides an ADC that includes a first stage and a second stage. The first stage includes a residue generating circuit having means for digitizing an analog input to generate a digital output, means for applying a first transfer function to the digital output from the means for digitizing the analog input, means for generating a feedforward path analog output based on a digital input generated by applying the first transfer function to the digital output from the means for digitizing the analog input, means for applying a second, continuous-time, transfer function to the analog input to generate a forward path analog output, and means for generating a residue signal based on a difference between the forward path analog output and the feedforward path analog output. The second stage (or multiple stages) are configured to process the residue signal received from the first stage.

Example 19 provides the ADC according to Example 18, where the first stage is a continuous-time stage and the second stage (or multiple stages) is a discrete-time stage. In other Examples, the second stage could also be a continuous-time stage.

Example 20 provides a method for generating a residue signal in a residue-generating analog-to-digital converter. The method includes digitizing an analog input to generate a digital output; applying a first transfer function to said digital output to generate a digital input for generating a feedforward path analog output; generating the feedforward path analog output based on said digital input; applying a second, continuous-time, transfer function to said analog input to generate a forward path analog output; and generating the residue signal based on a difference between the forward path analog output and the feedforward path analog output.

OTHER IMPLEMENTATION NOTES, VARIATIONS, AND APPLICATIONS

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

The present architecture for generating residue signals to be provided to subsequent stages of an ADC are particularly suitable for high speed, continuous-time, high precision applications where residue-generating ADCs are used. Applications which can greatly benefit from the architecture include: instrumentation, testing, spectral analyzers, military purposes, radar, wired or wireless communications, mobile telephones (especially because standards continue to push for higher speed communications), and base stations.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to residue generation, e.g. those summarized in the process shown in FIG. 9, illustrate only some of the possible functions that may be executed by, or within, the residue generation systems illustrated in FIGS. 2, 4A-4B, 5A-5B, 7A, and 8A. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A residue generation system for an analog to digital converter (ADC), the system comprising:
   a quantizer for digitizing an analog input to generate a digital output;
   means for applying a first transfer function to the digital output generated by the quantizer to generate a digital input to a feedforward digital to analog converter (DAC), where the means for applying the first transfer function includes means for up-sampling the digital output from the quantizer by an up-sampling factor L;
   the feedforward DAC for generating a feedforward path analog output based on the digital input;
   means for applying a second, continuous-time, transfer function to the analog input to generate a forward path analog output; and
   a subtractor for generating a residue signal based on the forward path analog output and the feedforward path analog output.

2. The residue generation system according to claim 1, wherein a combination of the first and second transfer functions is selected so that, when both are applied, the analog input, one or more aliases produced in the quantizer, and an out-of-band quantization error in the residue signal are canceled or reduced.

3. The residue generation system according to claim 1, wherein a clock frequency of the digital output from the quantizer is $f_{ck}$, and a clock frequency of the digital input to the feedforward DAC is $L \cdot f_{ck}$.

4. The residue generation system according to claim 1, wherein the means for applying the first transfer function further includes a digital finite impulse response (FIR) filter.

5. The residue generation system according to claim 4, wherein the FIR filter has a tap delay of $1/L \cdot f_{ck}$.

6. The residue generation system according to claim 5, wherein the digital FIR filter includes a delay line comprising M taps and M multipliers, each one of the M multipliers associated with one of the M taps, where:
M is an integer greater than or equal to 1,
a delay between any two consecutive taps of the M taps is $1/L \cdot f_{ck}$,
an output of each tap of the M taps is configured to be multiplied, using the associated one of the M multipliers, by a respective tap coefficient $a_i$ of the multiplier, and
outputs of the M multipliers are configured to be summed to generate the digital input provided to the feedforward DAC.

7. The residue generation system according to claim 5, wherein:
the digital FIR filter includes a delay line including M taps and M multipliers, each one of the M multipliers associated with one of the M taps, where M is an integer greater than or equal to 1,
a delay between any two consecutive taps of the M taps is $1/L \cdot f_{ck}$,
the feedforward DAC includes M DACs, where each one of the M DACs is merged with one of the M multipliers and where a full scale of each of the M DACs is proportional to a tap coefficient $a_i$ of the respective, and
outputs of the M DACs are configured to be summed to generate the feedforward path analog output.

8. The residue generation system according to claim 4, wherein the digital FIR filter includes a delay line comprising M taps and M multipliers, each one of the M multipliers associated with one of the M taps, where:
M is an integer greater than or equal to 1,
a delay between at least one pair of two consecutive taps of the M taps is different from a delay between at least one other pair of two consecutive taps of the M taps,
an output of each tap of the M taps is configured to be multiplied, using the associated one of the M multipliers, by a respective tap coefficient $a_i$ of the multiplier, and
outputs of the M multipliers are configured to be summed to generate the digital input provided to the feedforward DAC.

9. The residue generation system according to claim 4, wherein:
the digital FIR filter includes a delay line including M taps and M multipliers, each one of the M multipliers associated with one of the M taps, where M is an integer greater than or equal to 1,
a delay between at least one pair of two consecutive taps of the M taps is different from a delay between at least one other pair of two consecutive taps of the M taps,
the feedforward DAC includes M DACs, where each one of the M DACs is merged with one of the M multipliers and where a full scale of each of the M DACs is proportional to a tap coefficient $a_i$ of the respective multiplier, and
outputs of the M DACs are configured to be summed to generate the feedforward path analog output.

10. The residue generation system according to claim 1, further comprising means for canceling or reducing:
DAC images at a frequency $L \cdot f_{ck}$, and
DAC images at a frequency $K \cdot L \cdot f_{ck}$, where K is an integer greater than 1.

11. The residue generation system according to claim 10, further comprising means for canceling or reducing:
out-of-band quantization error at a frequency range of $L \cdot f_{ck} - 0.5 \cdot f_{ck}$ to $L \cdot f_{ck} + 0.5 \cdot f_{ck}$, and out-of-band quantization error at a frequency range of $K \cdot L \cdot f_{ck} - 0.5 \cdot f_{ck}$ to $K \cdot L \cdot f_{ck} + 0.5 \cdot f_{ck}$.

12. The residue generation system according to claim 1, wherein the means for applying the second transfer function includes means for applying an analog delay to phase-align signal components of the forward path analog output and of the feedforward path analog output so that, at least some of the signal components in the residue signal are canceled or reduced.

13. The residue generation system according to claim 1, wherein the means for applying the second transfer function includes a filter matching the first transfer function, configured to ensure that signal components of the forward path analog output and the feedforward path analog output are phase- and magnitude-aligned so that at least some of the signal components in the residue signal are canceled or reduced.

14. The residue generation system according to claim 1, wherein the system is a residue generator in a continuous-time or a hybrid ADC.

15. The residue generation system according to claim 1, wherein the first transfer function is a discrete-time transfer function or a continuous-time transfer function.

16. An analog-to-digital converter (ADC) comprising:
a first stage comprising a residue generation circuit that includes:
means for digitizing an analog input to generate a digital output,
means for applying a first transfer function to the digital output to generate a digital input, where the means for applying the first transfer function includes a digital finite impulse response (FIR) filter,
means for generating a feedforward path analog output based on the digital input,
means for applying a second, continuous-time, transfer function to the analog input to generate a forward path analog output, and
means for generating a residue signal based on a difference between the forward path analog output and the feedforward path analog output; and
a second stage configured to process the residue signal generated by the first stage.

17. The ADC according to claim 16, wherein the first stage is a continuous-time stage and the second stage is a discrete-time stage.

18. The ADC according to claim 16, wherein the digital FIR filter includes a delay line comprising M taps and M multipliers, an individual one of the M multipliers associated with one of the M taps, where:
M is an integer greater than or equal to 1,
an output of each tap of the M taps is to be multiplied, using the associated one of the M multipliers, by a respective tap coefficient $a_i$ of the multiplier, and
outputs of the M multipliers are to be summed to generate the digital input provided to the feedforward DAC.

19. The ADC according to claim 18, wherein a delay between at least one pair of two consecutive taps of the M taps is different from a delay between at least one other pair of two consecutive taps of the M taps.

20. The ADC according to claim 16, wherein:
the digital FIR filter includes a delay line including M taps and M multipliers, an individual one of the M multipliers associated with one of the M taps, where M is an integer greater than or equal to 1,
a delay between at least one pair of two consecutive taps of the M taps is different from a delay between at least one other pair of two consecutive taps of the M taps,
the feedforward DAC includes M DACs, where an individual one of the M DACs is merged with one of the M multipliers and where a full scale of each of the M DACs is proportional to a tap coefficient $a_i$ of the respective multiplier, and
outputs of the M DACs are to be summed to generate the feedforward path analog output.

21. The ADC according to claim 16, where the means for applying the first transfer function further includes means for up-sampling the digital output by an up-sampling factor L.

22. The ADC according to claim 16, wherein the residue generation circuit further includes means for canceling or reducing:
out-of-band quantization error at a frequency range of $L \cdot f_{ck} - 0.5 \cdot f_{ck}$ to $L \cdot f_{ck} + 0.5 \cdot f_{ck}$, and out-of-band quantization error at a frequency range of $K \cdot L \cdot f_{ck} - 0.5 \cdot f_{ck}$ to $K \cdot L \cdot f_{ck} + 0.5 \cdot f_{ck}$.

23. A method for generating a residue signal for a residue-generating analog-to-digital converter, comprising:
digitizing an analog input to generate a digital output;
applying a first transfer function to said digital output to generate a digital input for generating a feedforward path analog output;
generating the feedforward path analog output based on said digital input;
applying a second, continuous-time, transfer function to said analog input to generate a forward path analog output, where the second transfer function is a transfer function different from a delay; and
generating the residue signal based on a difference between the forward path analog output and the feedforward path analog output.

24. The method according to claim 22, where applying the first transfer function includes up-sampling the digital output from the quantizer by an up-sampling factor L.

25. A residue generation system for an analog to digital converter (ADC), the system comprising:
means for digitizing an analog input to generate a digital output;
means for applying a first transfer function to said digital output to generate a digital input for generating a feedforward path analog output;
means for generating the feedforward path analog output based on said digital input;
means for applying a second, continuous-time, transfer function to said analog input to generate a forward path analog output, where the second transfer function is a transfer function different from a delay; and
means for generating the residue signal based on a difference between the forward path analog output and the feedforward path analog output.

26. The residue generation system according to claim 25, wherein the means for applying the first transfer function includes means for up-sampling the digital output from the quantizer by an up-sampling factor L.

27. The residue generation system according to claim 25, wherein a clock frequency of the digital output is $f_{ck}$, and a clock frequency of the digital input is $L \cdot f_{ck}$.

28. The residue generation system according to claim 25, further comprising means for canceling or reducing:
DAC images at a frequency $L \cdot f_{ck}$, and
DAC images at a frequency $K \cdot L \cdot f_{ck}$, where K is an integer greater than 1.

29. The residue generation system according to claim 28, further comprising means for canceling or reducing:
out-of-band quantization error at a frequency range of $L \cdot f_{ck} - 0.5 \cdot f_{ck}$ to $L \cdot f_{ck} + 0.5 \cdot f_{ck}$, and out-of-band quantization error at a frequency range of $K \cdot L \cdot f_{ck} - 0.5 \cdot f_{ck}$ to $K \cdot L \cdot f_{ck} + 0.5 \cdot f_{ck}$.

* * * * *